United States Patent
Sambandamurthy et al.

(10) Patent No.: US 7,215,121 B2
(45) Date of Patent: May 8, 2007

(54) BALUN ARRANGEMENT AND INSTALLATION METHOD THEREOF FOR A MAGNETIC RESONANCE APPARATUS

(75) Inventors: Sriram Sambandamurthy, Bangalore (IN); Ken Hsieh, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 93 days.

(21) Appl. No.: 10/938,681

(22) Filed: Sep. 11, 2004

(65) Prior Publication Data

US 2006/0055408 A1    Mar. 16, 2006

(51) Int. Cl.
*G01V 3/00*    (2006.01)
*H01P 5/10*    (2006.01)

(52) U.S. Cl. .................... 324/318; 333/26; 333/33; 324/322

(58) Field of Classification Search ............... 324/322
See application file for complete search history.

(56) References Cited

U.S. PATENT DOCUMENTS

| | | | | |
|---|---|---|---|---|
| 5,059,906 A | * | 10/1991 | Yamanaka | ............ 324/318 |
| 5,484,985 A | * | 1/1996 | Edelstein et al. | ........... 219/772 |
| 6,215,307 B1 | * | 4/2001 | Sementchenko | ............ 324/318 |
| 6,284,971 B1 | * | 9/2001 | Atalar et al. | ................ 174/36 |
| 6,294,965 B1 | * | 9/2001 | Merrill et al. | ............... 333/26 |
| 6,320,385 B1 | * | 11/2001 | Burl et al. | ................ 324/322 |
| 6,392,502 B2 | * | 5/2002 | Sweeney et al. | .............. 333/26 |
| 6,608,480 B1 | * | 8/2003 | Weyers | ....................... 324/318 |
| 6,750,652 B2 | * | 6/2004 | Weyers et al. | .............. 324/318 |
| 2002/0003454 A1 | * | 1/2002 | Sweeney et al. | .............. 333/26 |
| 2006/0055408 A1 | * | 3/2006 | Sambandamurthy et al. | .... 324/318 |

OTHER PUBLICATIONS

Ferrara, CM editor, "MRI bearings have non-magnetic personality", Engineering News section of magazine Design News, published Jun. 7, 1999 (http://www.designnews.com/article/CA86896.html).*

* cited by examiner

*Primary Examiner*—Brij Shrivastav
*Assistant Examiner*—Tiffany A. Fetzner
(74) *Attorney, Agent, or Firm*—Carl Horton; Peter Vogel; Michael Smith

(57) ABSTRACT

A balun arrangement for a magnetic resonance apparatus which in some embodiments further comprises a cable member comprising at least one first ground end and at least one second ground end. A first capacitive element is electrically coupled to said first ground end and second ground end, wherein the cable member comprises a predetermined large surface area for dissipating substantial quantity of heat generated within the cable member.

20 Claims, 4 Drawing Sheets

BALUN ARRANGEMENT AND INSTALLATION METHOD THEREOF FOR A MAGNETIC RESONANCE APPARATUS

FIELD OF THE INVENTION

This invention relates generally to handling radio frequency (RF) signals, and more particularly, to balun arrangement and installation methods in a magnetic resonance apparatus, used especially in medical imaging.

BACKGROUND OF THE INVENTION

In a magnetic resonance imaging apparatus, especially in an RF coil, a balun (balance/unbalance) circuit is used as one means for reducing the noise and/or stray RF currents generated due to induced currents in a co-axial cable.

Known configurations of a balun circuit, especially for head coil in a magnetic resonance apparatus, include a box type-balun and a stripline balun for providing isolation between the grounds of the balanced and unbalanced end of the co-axial cable.

However, for high field magnetic resonance apparatus e.g. operating at a magnetic field strength of about 3 tesla, the ground shield currents are very high, and these known configurations (i) do not provide sufficient ground-to-ground isolation and also (ii) do not withstand temperature rise predetermined to meet the heat test specifications and optimum functioning of the balun circuit.

Thus, these known configurations do not effectively eliminate shield current (stray RF current) and hence does not contribute to sufficient noise reduction in co-axial cable transmission line.

BRIEF DESCRIPTION OF THE INVENTION

In an embodiment, a balun arrangement for a magnetic resonance apparatus is provided. The arrangement includes a cable member comprising at least one first ground end and at least one second ground end. A first capacitive element is electrically coupled to said first ground end and second ground end, wherein the cable member comprises a predetermined large surface area for dissipating substantial quantity of heat generated within the cable member.

In another embodiment, a magnetic resonance apparatus is provided. The apparatus comprises a magnetic resonance coil and a balun arrangement mounted on to said magnetic resonance coil. The balun arrangement comprises at least one cable member in combination with at least one capacitive element, wherein the combination is adapted for providing ground-to-ground isolation for the cable member and dissipating a substantial quantity of heat from the cable member.

In yet another embodiment, a method of installing a balun arrangement in a magnetic resonance coil is provided. The method includes mounting a cable member comprising a predetermined large surface area in combination with one or more capacitive elements on to a magnetic resonance coil. The combination is tuned to resonate at a frequency predetermined to provide ground-to-ground isolation for the cable member, wherein the surface of the cable member dissipates a substantial quantity of heat from the cable member.

DETAILED DESCRIPTION OF THE INVENTION

Various embodiments of the present invention provide a balun arrangement and a method for installing a balun in a magnetic resonance apparatus, especially for a head coil in a high field magnetic resonance apparatus used in medical imaging.

However, the embodiments are not so limited and may be implemented in connection with various other systems such as, for example, particle testing, etc.

In various embodiments, a balun arrangement for magnetic resonance apparatus is provided. Accordingly, the arrangement includes a cable member configured having a predetermined large surface, wherein the surface dissipates a substantial quantity of heat generated from within the cable member.

In particular, the balun arrangement includes a cable member comprising at least one first ground end and at least one second ground end, a first capacitive element electrically coupled to said first ground end and second ground end, wherein the cable member has a predetermined large surface area between the first ground end and the second ground end for dissipating substantial quantity of heat generated within the cable member.

However, in other embodiments a second capacitive element electrically coupled to the first capacitive element for generating resonance, may be provided to increase the ground-to-ground isolation for the cable member.

Figure 1:
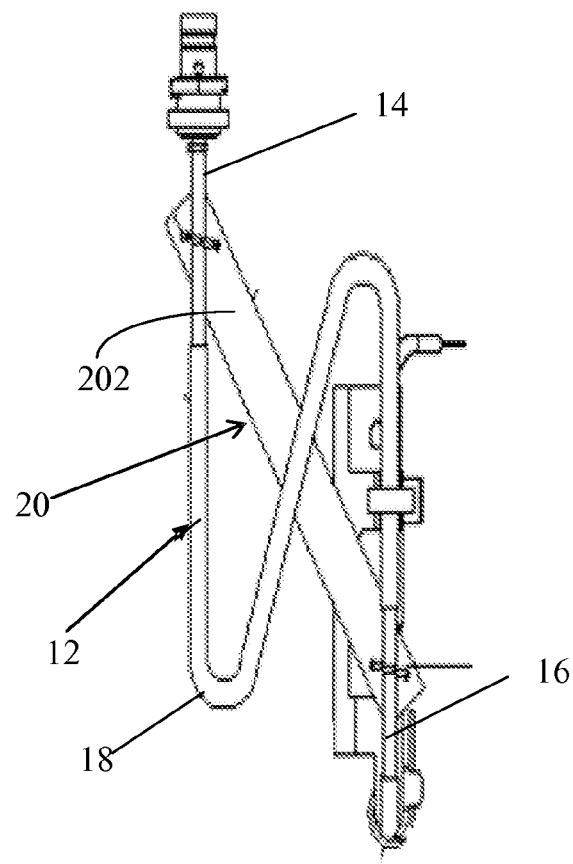
FIG. 1 shows the front view of the plan of the balun arrangement according to one embodiment of the present invention.

FIG. 1 shows a balun arrangement according to one embodiment of this invention. Accordingly, the balun arrangement includes a cable member 12 having a first ground end 14 and a second ground end 16. At least one bend portion 18 is provided in-between the first ground end 14 and the second ground end 16. The first ground end 14 and the second ground end 16 are secured to a printed circuit board (PCB) 20 as shown in FIG. 1.

In one example, the bend portion 18 in the cable member 12 includes an S-shaped configuration.

In other examples, the bend portion 18 may have other shapes such as, for example, C-shape, U-shape, L-shape, Z-shape, concord shape and a combination thereof.

It should be noted that the bend portion 18 provides an increased length and thereby a substantially large surface area for the cable member 12. A larger surface area increases dissipation of heat from the cable member 12. The size, shape and number of bend portions 18 in the cable member 12 may be predetermined to provide necessary large surface area and the amount of heat to be dissipated from the cable member 12.

It should also be noted that for a given length of cable member, the maximum number of bend portions 18 at minimum distance between the first ground end 14 and the second ground end 16 results in maximum surface area for heat dissipation and a much compact balun arrangement.

The cable member 12 may be a coaxial cable constructed of a semi-rigid material, such as, for example, a coaxial copper cable.

The resistance of the co-axial cable is in the range of about 45 to 55 ohms, preferably of about 50 ohms.

Figure 2:
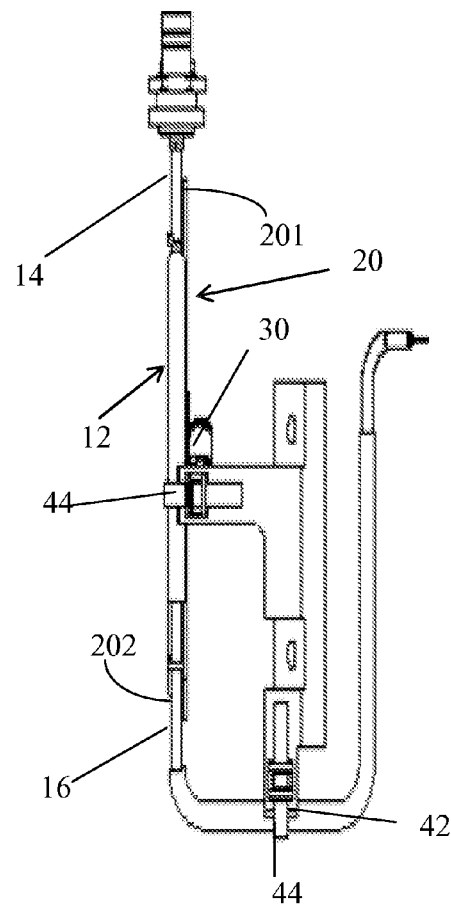
FIG. 2 shows a plan of the balun arrangement with a trimmer capacitor according to another embodiment of the present invention.

FIG. 2 shows an embodiment, wherein the PCB 20 includes a component side 201 (see FIG. 2) and a solder side 202, wherein a first capacitive element 30 (see FIG. 2) is mounted on the component side 201 and a solder board is mounted on the solder side 202 of the PCB 20. A first terminal and a second terminal of the first capacitive element 30 are soldered on to the solder board from the component side 201 on to the PCB.

In one example, the first capacitive element 30 includes a capacitor having a first terminal and a second terminal, wherein the first terminal is connected to first ground end of the cable member and the second terminal is connected to second ground end of the cable member. The capacitor may have a fixed or variable capacitance value. For example, the variable capacitor may be a trimmer capacitor.

It should be noted that this arrangement provides ground-to-ground isolation of the cable member 12 at the frequency of interest. This arrangement enables filtering the RF shield currents induced in the cable member 12 at the chosen frequency and hence provides excellent isolation desired between the first ground end 14 and the second ground end 16 of the cable member 12.

In another embodiment (not shown), a second capacitive element e.g. having a capacitor of fixed capacitance value is coupled electrically to the first capacitive element 30.

For example, the second capacitive element is coupled in parallel with the first capacitive element 30 to generate resonance at a predetermined frequency at which maximum isolation of the first ground end 14 and the second ground end 16 of the cable member 12 is desired.

It should be noted that generation of resonance at predetermined frequency results in increased ground-to-ground isolation of the cable member 12.

In an example, during installation of the balun arrangement in an MR (magnetic resonance) coil e.g. head coil, the first capacitive element 30 and the second capacitive element are tuned to resonate the balun arrangement at a predetermined frequency, after mounting the balun arrangement on to the MR coil.

However, in other examples, based on the application and requirement, the balun arrangement can be tuned to resonate apriori to the installation on to the coil.

Figure 3:
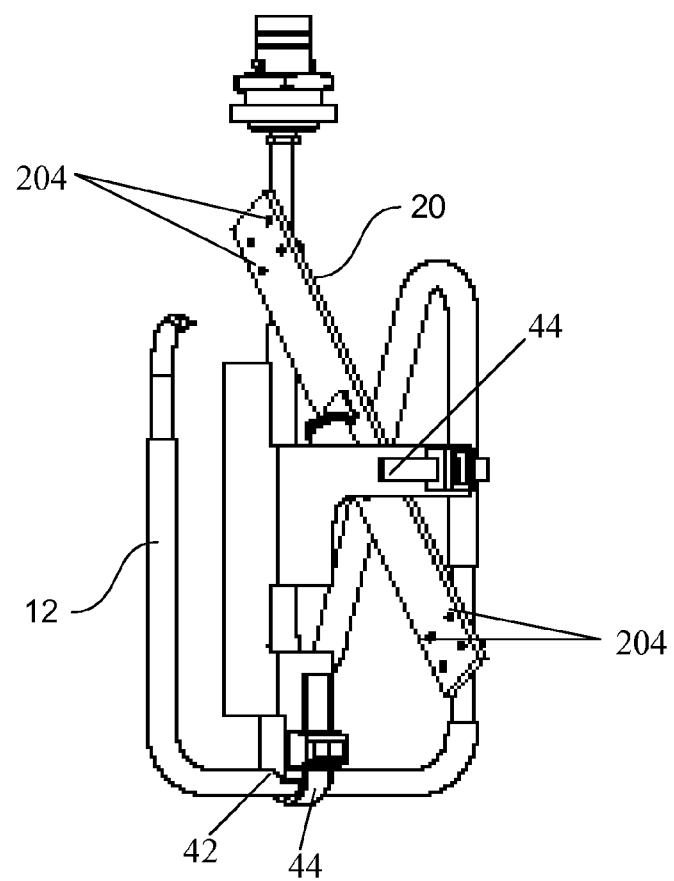
FIG. 3 shows a perspective view of the balun arrangement showing a printer circuit board according to one embodiment of the present invention.

FIG. 3 shows an embodiment, wherein the PCB 20 comprises a plurality of apertures 204 at the ends. For example, the apertures 204 are configured in rows and columns at the ends of the PCB 20.

Figure 4:
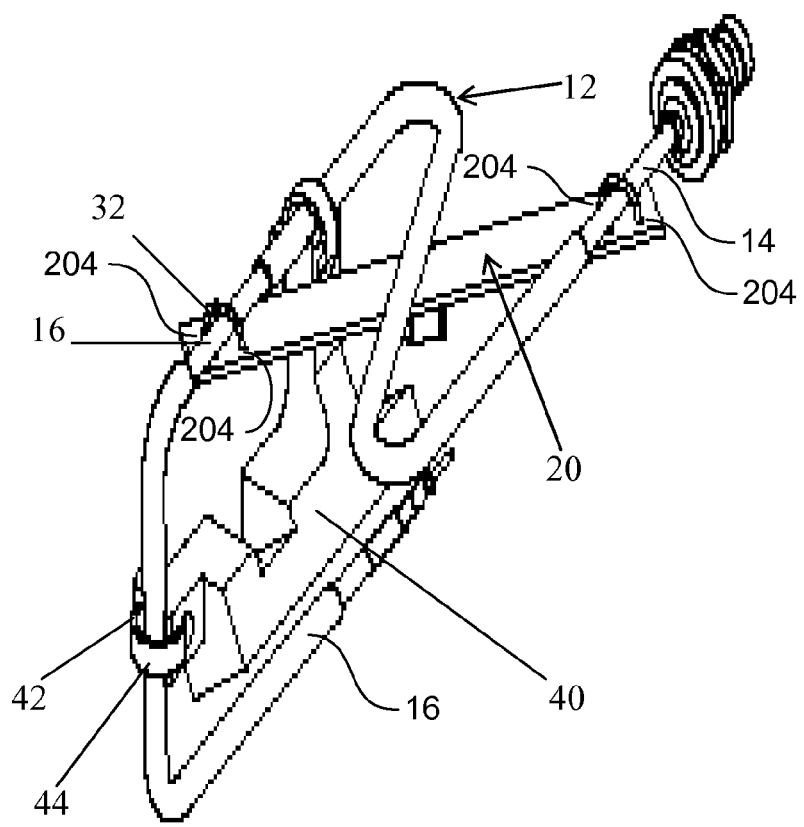
FIG. 4 shows a perspective view of the balun arrangement showing the mounting block according to one embodiment of the present invention.

In an embodiment shown in FIG. 4, the PCB 20 is configured at an inclined position with respect to the first ground end 14 and the second ground end 16 of the cable member 12.

In one embodiment, a wire 32 e.g. a metallic wire is inserted through the apertures 204 as shown in FIG. 1. The wire 32 through two diagonal apertures 204 connects the first ground end 14 of the cable member 12 electrically on to the PCB 20. The wire 32 may be soldered on to the PCB 20 for connecting and securing the cable member 12 to the PCB 20. Similarly, a separate wire may be used for connecting the second ground end 16 of the cable member 12 at the opposite end of the PCB 20.

However, in other embodiments, a press-fit type clamp or a clip may be used to hold the ends of the cable member 12 in predetermined position with the PCB 20.

Accordingly, this invention provides a balun arrangement wherein the arrangement uses an open-ended coaxial cable to eliminate the shield currents, without affecting the electrical performance of the MR coil.

A mounting block 40 is provided to hold the balun arrangement intact.

It should be noted that mounting block 40 may be implemented in configurations in which the balun arrangement is likely to be subjected to vibrations. The mounting block 40 maintains the balun arrangement substantially free from vibrations arising out of high magnetic field in a magnetic resonance apparatus at resonance.

In one example, the mounting block 40 is secured to a plastic former of the head coil (not shown) by a fastener such as, for example, at least a nylon screw. A groove 42 may be provided individually at the ends of the mounting block 40 to snugly fit the cable member 12 within the groove 42. The cable member 12 is secured to the mounting block 40 at the groove 42 through a tie member 44 such as, a cable strap, a tie at either ends.

In one example, the mounting block 40 is constructed of a non-magnetic and non-metallic material such as a rigid plastic material e.g. white acetal.

It should be noted that the use of a plastic material enables easy manufacturing of the mounting block 40 and provides a safe medical imaging environment. The use of acetal material ensures that the acquired images are devoid of any artifacts.

Thus, various embodiments of the present invention provide a balun arrangement and installation method thereof in a magnetic resonance apparatus. Further embodiments provide a magnetic resonance apparatus having a construction to provide effective ground-to-ground isolation and also improved heat dissipation characteristics.

While the invention has been described in terms of various specific embodiments, those skilled in the art will recognize that the invention can be practiced with modifications. However all such modifications are deemed to have been covered within the spirit and scope of the claims.

What is claimed is:

1. A balun arrangement that is usable with a magnetic resonance apparatus at resonance comprising:
   a cable member having at least one first ground end and at least one second ground end; and
   at least one first capacitive element including a first terminal and a second terminal, said first capacitive element electrically coupled to said first ground end and second ground end,
   said cable member configured to have a predetermined large surface between the first ground end and the second ground end, wherein the surface dissipates a substantial quantity of heat from the cable member, and
   a mounting block having a groove,
   wherein the cable member comprises at least one bent portion, wherein the bent portion provides a predetermined large surface area for the cable member, and
   wherein the cable member is secured to the mounting block at the groove, with the mounting block being operable in order to maintain the cable member in a position predetermined to be substantially free from vibrations arising out of a high magnetic field when the balun arrangement is within a magnetic resonance apparatus at resonance.

2. A balun arrangement according to claim 1 further comprises a printed circuit board including a plurality of apertures wherein the cable member is connected to the printed circuit board by a soldered wire through the apertures on to the printer circuit board.

3. A balun arrangement according to claim 2 wherein the printed circuit board further comprises a component side and a solder side, wherein a first capacitive element is mounted on the component side and a solder board is mounted on the solder side of the printed circuit board.

4. A balun arrangement according to claim 1 wherein the cable member further comprises a co-axial cable.

5. A balun arrangement according to claim 4 wherein the co-axial cable further comprises a semi-rigid material.

6. A balun arrangement according to claim 1 further comprising a second capacitive element configured to have a capacitance value predetermined to generate resonance at a predetermined frequency in combination with the first capacitive element.

7. A balun arrangement, according to claim 1, wherein the bent portion further comprises at least one of a substantially S-shape, C-shape, U-shape, L-shape, Z-shape, concord shape and combinations thereof.

8. A balun arrangement, according to claim 1, wherein the mounting block is constructed out of a non-magnetic material.

9. A magnetic resonance apparatus, comprising:
a magnetic resonance coil; and
a balun arrangement mounted to said magnetic resonance coil; said balun arrangement comprising
at least one cable member in combination with at least one capacitive element; and
a mounting block having a groove, which holds the balun arrangement intact with the cable member being secured to the mounting block at the groove, wherein:
said combination of the magnetic resonance coil, cable member, the at least one capacitive element, and mounting block is configured for:
(i) providing ground-to-ground isolation of the cable member;
(ii) dissipating a substantial quantity of heat from the cable member; and
(iii) maintaining the cable member in a position predetermined to maintain the balun arrangement substantially free from vibrations arising out of a high magnetic field in a magnetic resonance apparatus at resonance, and
wherein the cable member comprises at least one bent portion, with the bent portion providing the cable member with a predetermined large surface area that is utilized in the dissipating of a substantial quantity of heat from the cable member.

10. An apparatus according to claim 9 wherein the apparatus further comprises a printed circuit board including a plurality of apertures wherein the cable member is connected to the printed circuit board by a soldered wire through the apertures on to the printer circuit board.

11. An apparatus according to claim 10 wherein the printed circuit board further comprises a component side and a solder side, wherein a first capacitive element is mounted on the component side and a solder board is mounted on the solder side of the printed circuit board.

12. An apparatus according to claim 9 wherein the cable member further comprises a semi-rigid material.

13. An apparatus according to claim 12 wherein the cable member further comprises a coaxial cable.

14. An apparatus according to claim 9 wherein the combination is configured to generate resonance at a frequency predetermined to provide ground-to-ground isolation for the cable member.

15. An apparatus according to claim 14, wherein the bent portion further comprises at least one of a substantially S-shape, C-shape, U-shape, L-shape, Z-shape, concord shape and combinations thereof.

16. An apparatus according to claim 9, wherein the mounting block further comprises a plastic material.

17. An apparatus according to claim 9, wherein the mounting block further comprises acetal.

18. An apparatus according to claim 9 further comprising a printed circuit board including a plurality of apertures wherein the cable member is connected to the printed circuit board by a soldered wire through the apertures on to the printed circuit board.

19. A method of installing a balun arrangement within a magnetic resonance apparatus, comprising:
mounting a balun arrangement comprising a cable member in combination with one or more capacitive elements on to, a magnetic resonance coil;
mounting a mounting block having a groove, to said magnetic resonance coil, and to said balun arrangement;
wherein the mounting block is in a position predetermined to maintain the balun arrangement substantially free from vibrations of the cable member arising out of a high magnetic field at resonance; and
tuning the combination of said magnetic resonance coil, cable member, and said one or more capacitive elements, in order to resonate at a frequency predetermined to provide ground-to-ground isolation for the cable member;
wherein the cable member comprises at least one bent portion, with the bent portion of the cable member providing a predetermined large surface area; and
wherein the surface area of the cable member is predetermined to dissipate a substantial quantity of heat from the cable member.

20. A method according to claim 19 wherein the cable member is a semi-rigid coaxial cable.

* * * * *